US011791609B2

(12) United States Patent
Pan et al.

(10) Patent No.: US 11,791,609 B2
(45) Date of Patent: Oct. 17, 2023

(54) SURFACE EMITTING LASER WITH HYBRID GRATING STRUCTURE

(71) Applicant: TRUELIGHT CORPORATION, Hsinchu (TW)

(72) Inventors: Chien Hung Pan, Hualien County (TW); Cheng Zu Wu, Hsinchu County (TW)

(73) Assignee: TrueLight Corporation

( * ) Notice: Subject to any disclaimer, the term of this patent is extended or adjusted under 35 U.S.C. 154(b) by 409 days.

(21) Appl. No.: 17/033,763

(22) Filed: Sep. 26, 2020

(65) Prior Publication Data

US 2021/0143610 A1 May 13, 2021

(30) Foreign Application Priority Data

Nov. 13, 2019 (TW) .................................. 108141251

(51) Int. Cl.
*H01S 5/11* (2021.01)
*H01S 5/12* (2021.01)
(Continued)

(52) U.S. Cl.
CPC ................ *H01S 5/11* (2021.01); *H01S 5/124* (2013.01); *H01S 5/1215* (2013.01); *H01S 5/183* (2013.01);
(Continued)

(58) Field of Classification Search
CPC .......... H01S 5/11; H01S 5/1215; H01S 5/124; H01S 5/183; H01S 5/185; H01S 5/3211
See application file for complete search history.

(56) References Cited

U.S. PATENT DOCUMENTS 5,617,436 A * 4/1997 Lo ........................... H01S 5/187
372/102
6,975,664 B1 * 12/2005 Dodabalapur ........ H01S 3/0933
385/125
(Continued)

FOREIGN PATENT DOCUMENTS

WO WO-2017220144 A1 * 12/2017 ........... H01S 5/1237

*Primary Examiner* — Yuanda Zhang

(57) ABSTRACT

The grating layer of a surface emitting laser is divided into a first grating region and a second grating region along a horizontal direction. The second grating region is located at a middle area of the grating layer, while the first grating region is located in an outer peripheral area of the grating layer. Each of the first and second grating regions comprises a plurality of micro-grating structures. The grating period of the micro-grating structures in the first grating region is in accordance with the following mathematical formula:

$$\Lambda = m\frac{\lambda}{2*n_{\it{eff}}};$$

in addition, the grating period of the micro-grating structures in the second grating region is in accordance with the following mathematical formula:

$$\Lambda = o\frac{\lambda}{2*n_{\it{eff}}}.$$

Wherein, $\Lambda$ is the length of grating period, $\lambda$ is the wavelength of the laser light, $n_{\it{eff}}$ is the equivalent refractive index of semiconductor waveguide, m=1, and o=2. The first grating region is a first-order grating region, and the second grating region is a second-order grating region, so as to form
(Continued)

a hybrid grating structure in the grating layer. The surface emitting laser emits laser light perpendicularly from a light-emitting surface defined by the second grating region.

9 Claims, 16 Drawing Sheets

(51) Int. Cl.
    *H01S 5/183*     (2006.01)
    *H01S 5/32*     (2006.01)
    *H01S 5/185*     (2021.01)

(52) U.S. Cl.
    CPC ............ *H01S 5/185* (2021.01); *H01S 5/3211* (2013.01); *H01S 2304/04* (2013.01)

(56) References Cited

U.S. PATENT DOCUMENTS

| | | | |
|---|---|---|---|
| 2009/0147818 A1* | 6/2009 | Baumann | .................. H01S 5/18 372/96 |
| 2021/0013699 A1* | 1/2021 | Guo | .................... H01S 5/04256 |

* cited by examiner

L2=0 μm

L2=50 μm

L2=100 μm

L2=150 μm

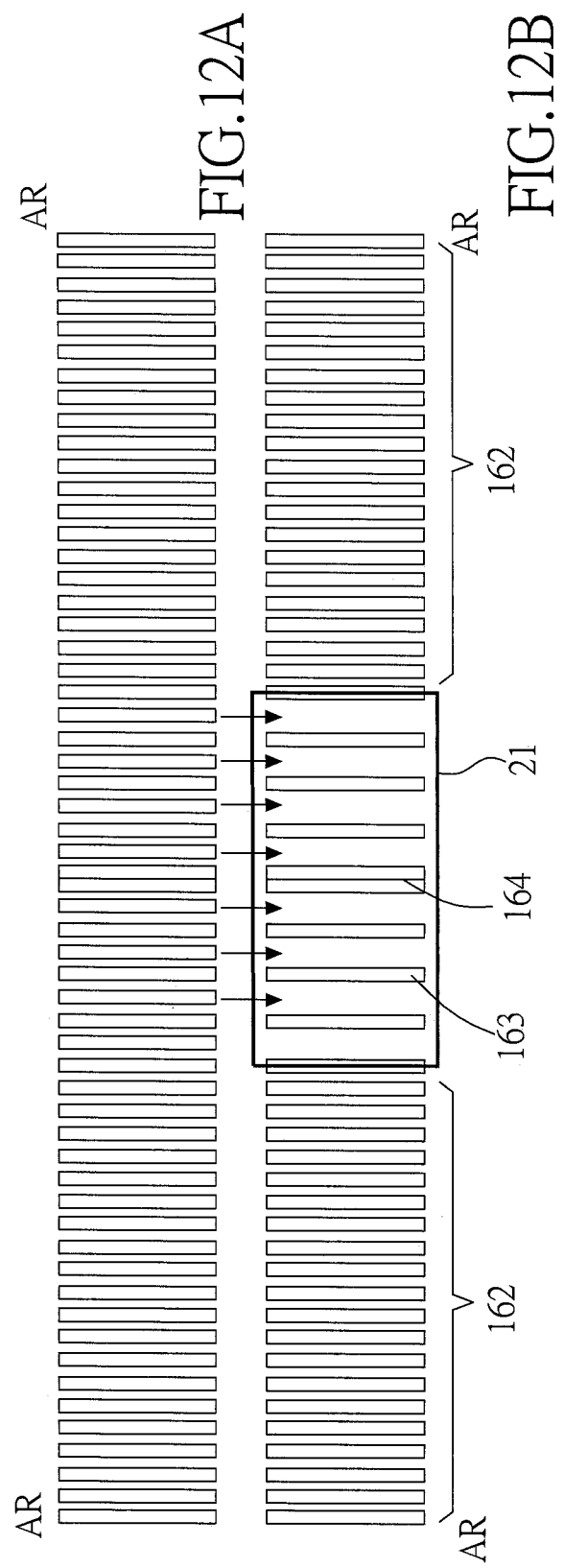

SURFACE EMITTING LASER WITH HYBRID GRATING STRUCTURE

This application claims the benefit of Taiwan Patent Application Serial No. 108141251 filed Nov. 13, 2019, the subject matter of which is incorporated herein by reference.

BACKGROUND OF INVENTION

1. Field of the Invention

The invention relates to a surface emitting laser with hybrid grating structure and a fabricating method thereof, and more particularly to a surface emitting laser having a hybrid grating structure that is divided into two grating regions with different orders of grating periods.

2. Description of the Prior Art

Conventionally, the semiconductor laser, or called as the laser diode, is featured in small volume, low power consumption, quick response, well impact resistance, long service life, high efficiency, low price and so on. Thereupon, the semiconductor laser is widely applied to products for electro-optical systems, such as lightwave communications, information systems, household appliances, precision measurements, optical fiber communications and so on. In particular, in the optical fiber communications, since the distributed feedback (DFB) laser is featured in simple manufacturing, mono-mode output, long-distance transmission and so on, the laser signal generated by the DFB laser can still maintain an acceptable signal/noise ratio even after experiencing long-distance transmission. Hence, the DFB laser has become one of popular light sources for modern lightwave communications and optical fiber communication system.

FIG. 1 is a schematic sectional view of a typical surface emitting distributed feedback laser (SE-DFB), which comprises sequentially from bottom to top: a semiconductor substrate 91, a lower cladding layer, a lower separated confinement hetero-structure (SCH), an active region layer 92, an upper SCH, a spacer layer, a grating layer 93, an upper cladding layer 94, a contact layer, and so on. According to the design difference of the periods of the micro-grating structures contained in the grating layer, SE-DFB lasers can generally be divided into first-order grating structure design or second-order grating structure design. The so-called first-order or second-order grating structure design is determined based on the following formula:

$$\Lambda = m \frac{\lambda}{2 * n_{eff}};$$

wherein, $\Lambda$ is the length of grating period of two neighboring micro-grating structures, $\lambda$ is the wavelength of the laser light emitted by the SE-DFB, $n_{eff}$ is the effective refractive index of semiconductor waveguide, and m is the value of so-called "order". It can be understood that, when m=1, the period value of the micro-grating structure $\Lambda$ roughly corresponds to one-half of the laser wavelength $\lambda$ (that is, $\lambda/2$), and the micro-grating structures included in the grating layer can be called as the first-order grating structures. In addition, when m=2, the period value of the micro-grating structure $\Lambda$ roughly corresponds to the laser wavelength $\lambda$, and the micro-grating structures included in the grating layer can be called as the second-order grating structures. At this time, there will be first-order and second-order diffractions, respectively corresponding to the coupling constant κ1 (related to the efficiency of surface light emission) and κ2 (related to the efficiency of formation of in-plane cavity).

Suppose the micro-grating structure is a teeth-like shape (as shown in FIG. 1), κm are referring to coupling constants (κm) of different in-plane cavities obtained from grating structures of different orders, in which, κm is proportional to $Sin[\pi*m*ratio]/(\pi*m)$. Wherein, "m" is the value of order; "ratio" is the duty cycle of grating, that is, ratio=a/$\Lambda$ as shown in FIG. 1; where "a" is the gap value between two adjacent micro-grating structures. Please refer to FIG. 2, which is a curve graph showing the relationship between the ratio values and the coupling constant (κm) values of the in-plane cavity when m=1 and m=2. It can be seen from FIG. 2 that, comparing the curves of m=1 (first-order grating structure) and m=2 (second-order grating structure), the efficiency of the in-plane cavity formed by the second-order grating structure is generally lower than that of the first-order grating structure.

The SE-DFB laser formed based on the second-order grating structure design has many advantages, such like the laser emitting angle is small, and the on wafer test and burn-in test can be performed in the wafer state. Moreover, unlike ordinary edge emitting DFB lasers that require mirror splitting and coating, the principle of SE-DFB laser formed according to the second-order grating structure is to make the micro-grating structure whose period value is $\lambda/n_{eff}$; in this way, the second-order diffraction of the micro-grating structure is used in-plane for coupling the forward and backward modes in the waveguide to form a cavity to emit laser light (lasing), and to couple the laser light from the top surface of the SE-DFB laser.

Because that, when the SE-DFB laser formed by the second-order grating structure is in operation, the first-order and the second-order are simultaneously occurred in the optical mode, in addition to the above-mentioned lower efficiency of the second order diffraction acts as cavity feedback, there is also an additional first-order diffracted light output coupling loss (light output coupling loss), therefore, such components often require a larger area and a larger threshold current ($I_{th}$) to operate, which is its disadvantage.

Therefore, the present invention provides a novel design of surface emitting distributed feedback laser (SE-DFB), which integrates the first-order and second-order grating structures in the same grating layer. The low-loss first-order grating structure is formed at the end-surface of laser to act as a high-efficiency reflection feedback area, while the second-order grating structure is formed only at the area near to the middle of the laser emitting surface. In this way, it is possible to achieve the desired balance between the pursuit of high slope efficiency (meaning a larger second-order grating structure area) and low critical current value $I_{th}$ (meaning a smaller second-order grating structure area). A $\lambda/4$-Shift phase-shift grating structure can also be introduced in the center of the second-order grating structure area, in order to make the laser light field modal stabilized and to improve the optical coupling efficiency of emitted laser light.

SUMMARY OF THE INVENTION

The primary objective of the invention is to provide a surface emitting laser with hybrid grating structure and a fabricating method thereof, which integrates the first-order and second-order grating structures to form a hybrid grating structure in the same grating layer, so as to achieve the desired balance between the pursuit of high slope efficiency and low critical current value $I_{th}$. In addition, a λ/4-Shift phase-shift grating structure can also be introduced in the center of the second-order grating structure area, in order to make the laser light field modal stabilized and to improve the optical coupling efficiency of emitted laser light.

Another objective of the invention is to provide a surface emitting laser, the same concept of the aforementioned primary objective is transformed from a one-dimensional grating structure to a two-dimensional photonic crystal surface emitting laser (PCSEL). The first-order photonic crystals are formed around the laser component, and the second-order photonic crystals are formed only in the middle of the light-emitting surface, and a phase-shift structure is properly introduced to manipulate the modal. It is also possible to deploy several light-emitting areas at the same time (that is, only deploy second-order photonic crystals at the light-emitting locations) to achieve an effect similar to a multi-light source two-dimensional array phase lock (2D array phase lock).

In order to achieve the aforementioned objectives, the invention provides a surface emitting laser with hybrid grating structure, which comprises: a semiconductor-laminated structure and a grating layer. The semiconductor-laminated structure is capable of generating a laser light with a laser wavelength when receiving a predetermined current; the laser light being emitted vertically upward from a light-emitting surface of the semiconductor-laminated structure; the light-emitting surface being located on a top surface of the semiconductor-laminated structure. The grating layer is formed on the semiconductor-laminated structure. The grating layer includes a plurality of micro-grating structures distributed and arranged along at least a first horizontal direction. Wherein, the grating layer is divided into at least one first grating region and at least one second grating region at least along the first horizontal direction; each of the first and second grating regions respectively contains a plurality of the micro-grating structures. Wherein, a grating period of the micro-grating structures in the first grating region is in accordance with the following mathematical formula:

$$\Lambda = m\frac{\lambda}{2*n_{eff}};$$

in addition, the grating period of the micro-grating structures in the second grating region is in accordance with the following mathematical formula:

$$\Lambda = o\frac{\lambda}{2*n_{eff}};$$

wherein, $\Lambda$ is a length of grating period, $\lambda$ is a wavelength of the laser light, $n_{eff}$ is an equivalent refractive index of semiconductor waveguide, both m and o are integrals, m is not equal to o, and o is an even multiple of m; wherein, the light-emitting surface is defined by the second grating region.

In an embodiment of the invention, m=1, and o=2; therefore, the first grating region is a first-order grating region, and the second grating region is a second-order grating region, so as to form a hybrid grating structure in the grating layer; the surface emitting laser emits laser light perpendicularly from the light-emitting surface defined by the second grating region.

In an embodiment of the invention, the grating layer further includes a phase-shift grating structure; the phase-shift grating structure is located near a middle of the second grating region in the first horizontal direction; the width of the phase-shift grating structure can provide a phase-difference distance, such that a phase difference is formed between the micro-grating structures located on both sides of the phase-shift grating structure along the first horizontal direction; the phase-difference distance provided by the phase-shift grating structure is one quarter of the laser wavelength.

In an embodiment of the invention, the number of the second grating region is one and is located in a middle area of the grating layer in the first horizontal direction, such that the first grating region is substantially divided into left and right parts in the first horizontal direction by the second grating region; wherein, a width of the second grating region in the first horizontal direction is between one-sixth to one-half of the total width of the grating layer; the widths of the left and right parts of the divided first grating region are approximately equal.

In an embodiment of the invention, the grating layer also has a plurality of micro-grating structures along a second horizontal direction; the second horizontal direction is perpendicular to the first horizontal direction, and both the second horizontal direction and the first horizontal direction are perpendicular to the emitting direction of the laser light; the grating layer is also divided into at least one first grating region and at least one second grating region along the second horizontal direction, each of the first and second grating regions also contains a plurality of the micro-grating structures respectively; when viewed downwardly from the top surface of the semiconductor-laminated structure, the micro-grating structures are arranged in a dot-like array on the grating layer; in addition, the second grating region in the first horizontal direction and the second grating region in the second horizontal direction cooperate to define at least one rectangular light-emitting surface.

In an embodiment of the invention, the grating layer comprises two phase-shift grating structures; one of the phase-shift grating structures is located near a middle of the second grating region in the first horizontal direction, the other phase-shift grating structure is located near another middle of the second grating region in the second horizontal direction; the width of each of the phase-shift grating structures can provide a phase-difference distance, such that a phase difference is formed between the micro-grating structures located on both sides of the phase-shift grating structure along the first horizontal direction and the second horizontal direction respectively; the phase-difference distance provided by the phase-shift grating structure is one quarter of the laser wavelength.

In an embodiment of the invention, the second grating region is located in an intermediate region of the grating layer in both the first horizontal direction and the second horizontal direction; when viewed downwardly from the top surface of the semiconductor-laminated structure, the second grating region is located in a central region of the top surface of the semiconductor-laminated structure, and the first grating region is substantially surrounding an outer peripheral region of the second grating region; wherein, the widths of the second grating region in the first horizontal direction and the second horizontal direction are each between ⅙ to ½ of the total width of the grating layer in the first horizontal direction and the second horizontal direction respectively.

In an embodiment of the invention, the top surface of the semiconductor-laminated structure includes a plurality of individual said light-emitting surfaces separated from each other and arranged in an array; the grating layer is provided with the second grating region at each said light-emitting surface, no matter in the first horizontal direction or the second horizontal direction; in addition, except for the light-emitting surfaces, other portions of the grating layer are all provided with the first grating region regardless of whether it is in the first horizontal direction or the second horizontal direction; a plurality of small and individual said light-emitting surfaces that are separated from each other and arranged in the array can thus be defined on the top surface of the semiconductor-laminated structure.

In an embodiment of the invention, the semiconductor-laminated structure comprises: a semiconductor substrate, a lower cladding layer located on the substrate, a lower separated confinement hetero-structure (SCH) located on the lower cladding layer, an active region layer located on the lower SCH layer, an upper SCH layer located on the active region layer, a spacer located on the upper SCH layer, an upper cladding layer located on the grating layer, and a contact layer located above the upper cladding layer. Wherein, the grating layer is located in the upper cladding layer.

In order to achieve the aforementioned objectives, the invention provides a method for fabricating a surface emitting laser with hybrid grating structure. The method comprises the following steps:

STEP (A): applying a semiconductor epitaxy process to form a semiconductor-laminated structure on a semiconductor substrate; the semiconductor-laminated structure generating a laser beam with a laser wavelength upon receiving an electric current; the semiconductor-laminated structure emitting the laser beam from a light-emitting surface located at a top surface of the semiconductor-laminated structure;

STEP (B): applying an e-beam writer process and a nano imprint process to form a grating layer on the semiconductor-laminated structure; the grating layer comprising a plurality of micro-grating structures arranged at least in a first horizontal direction;

STEP (C): applying an epitaxy process and a yellow-light process to form an upper cladding layer and a contact layer on the grating layer;

wherein, the grating layer is divided into at least one first grating region and at least one second grating region at least along the first horizontal direction, each of the first and second grating regions contains a plurality of the micro-grating structures respectively; wherein, the grating period of the micro-grating structures in the first grating region is in accordance with the following mathematical formula:

$$\Lambda = m \frac{\lambda}{2 * n_{eff}};$$

in addition, the grating period of the micro-grating structures in the second tin region is in accordance with the following mathematical formula:

$$\Lambda = o \frac{\lambda}{2 * n_{eff}};$$

wherein, $\Lambda$ is a length of grating period; $\lambda$ is a wavelength of the laser light; $n_{eff}$ is an the equivalent refractive index of semiconductor waveguide; both m and o are integrals; m is not equal to o; and o is an even multiple of m; wherein, the light-emitting surface is defined by the second grating region.

In order to achieve the aforementioned objectives, the invention provides a surface emitting laser, which comprises: a semiconductor-laminated structure and a photonic crystal layer. The semiconductor-laminated structure is capable of generating a laser light with a laser wavelength when receiving a predetermined current. The laser light is emitted vertically upward from a light-emitting surface of the semiconductor-laminated structure. The light-emitting surface is located on a top surface of the semiconductor-laminated structure. The photonic crystal layer is formed on the semiconductor-laminated structure. The photonic crystal layer includes a plurality of micro photonic crystal structures distributed and arranged along both a first horizontal direction and a second horizontal direction. The second horizontal direction is perpendicular to the first horizontal direction. The photonic crystal layer is divided into at least one first photonic crystal region and at least one second photonic crystal region along both the first horizontal direction and the second horizontal direction. Each of the first and second photonic crystal regions contains a plurality of the micro photonic crystal structures respectively. Wherein, a photonic crystal period of the micro photonic crystal structures in the first photonic crystal region is in accordance with the following mathematical formula:

$$\Lambda = m \frac{\lambda}{2 * n_{eff}};$$

in addition, another photonic crystal period of the plurality of micro photonic crystal structures in the second photonic crystal region is in accordance with the following mathematical formula:

$$\Lambda = o \frac{\lambda}{2 * n_{eff}}.$$

Wherein, $\Lambda$ is a length of photonic crystal period; $\lambda$ is a wavelength of the laser light; $n_{eff}$ is an equivalent refractive index of semiconductor waveguide; both m and o are integrals; m is not equal to o; and o is an even multiple of m. Wherein, the light-emitting surface is defined by the second photonic crystal region.

In an embodiment of the invention, the photonic crystal layer comprises two phase-shift photonic crystal structures; one of the phase-shift photonic crystal structures is located near a middle of the second photonic crystal region in the first horizontal direction, the other phase-shift photonic crystal structure is located near another middle of the second photonic crystal region in the second horizontal direction; the width of each of the phase-shift photonic crystal structures can provide a phase-difference distance, such that a phase difference is formed between the micro photonic crystal structures located on both sides of the phase-shift photonic crystal structure along the first horizontal direction and the second horizontal direction respectively; the phase-difference distance provided by the phase-shift photonic crystal structure is one quarter of the laser wavelength.

In an embodiment of the invention, the top surface of the semiconductor-laminated structure includes a plurality of individual said light-emitting surfaces separated from each other and arranged in an array; the photonic crystal layer is provided with the second photonic crystal region at each said light-emitting surface, no matter in the first horizontal direction or the second horizontal direction; in addition, except for the light-emitting surfaces, other portions of the photonic crystal layer are all provided with the first photonic crystal region regardless of whether it is in the first horizontal direction or the second horizontal direction; a plurality of small and individual said light-emitting surfaces that are separated from each other and arranged in the array can thus be defined on the top surface of the semiconductor-laminated structure.

BRIEF DESCRIPTION OF THE DRAWINGS

The present invention will now be specified with reference to its preferred embodiment illustrated in the drawings, in which:

FIG. 12A and FIG. 12B respectively are the schematic diagrams of micro-grating structures of the traditional distributed feedback laser component with merely the first-order grating structure, and the surface emitting laser component with the first-order and second-order hybrid grating structure of the present invention;

DESCRIPTION OF THE PREFERRED EMBODIMENT

The invention disclosed herein is directed to a surface emitting distributed feedback laser (SE-DFB laser) with a hybrid grating structure and a fabricating method thereof. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
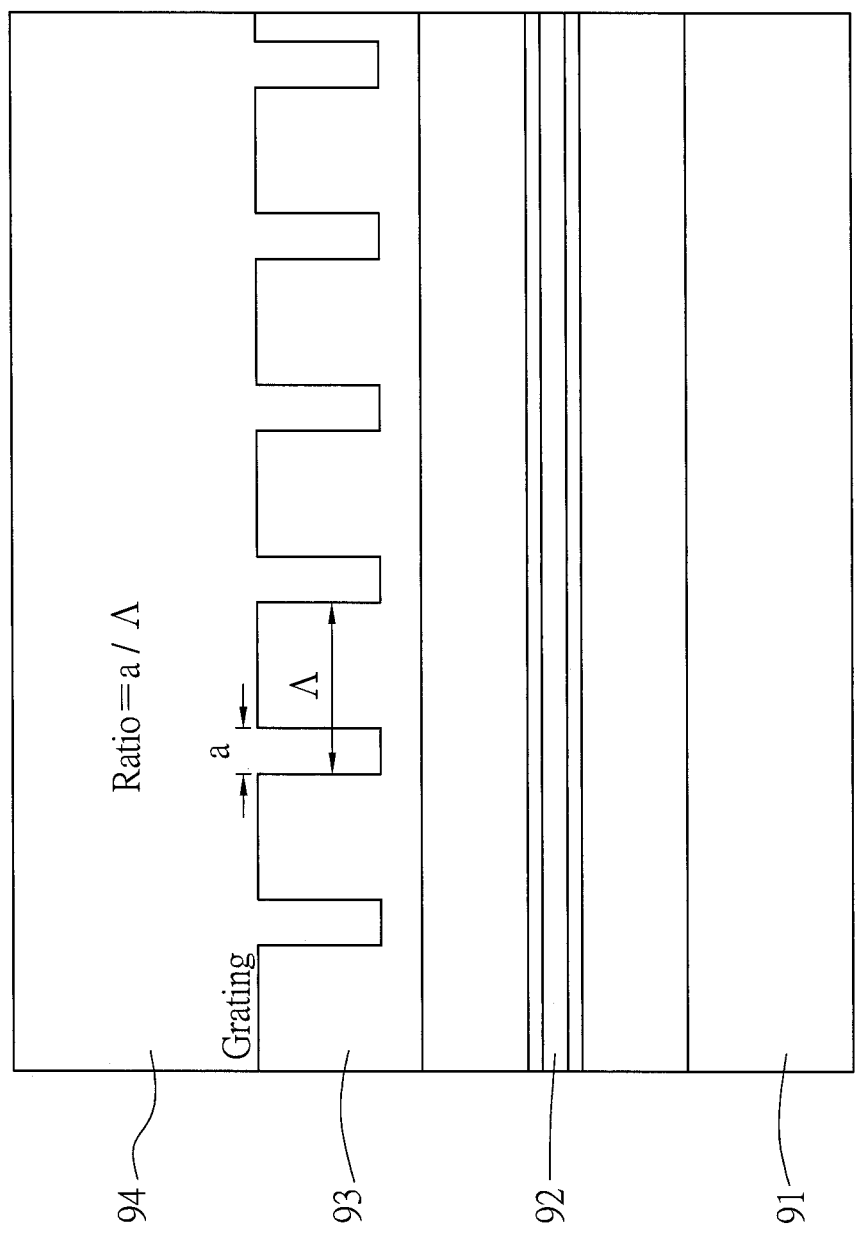
FIG. 1 is a schematic sectional view of a typical surface emitting distributed feedback laser (SE-DFB)
Figure 2:
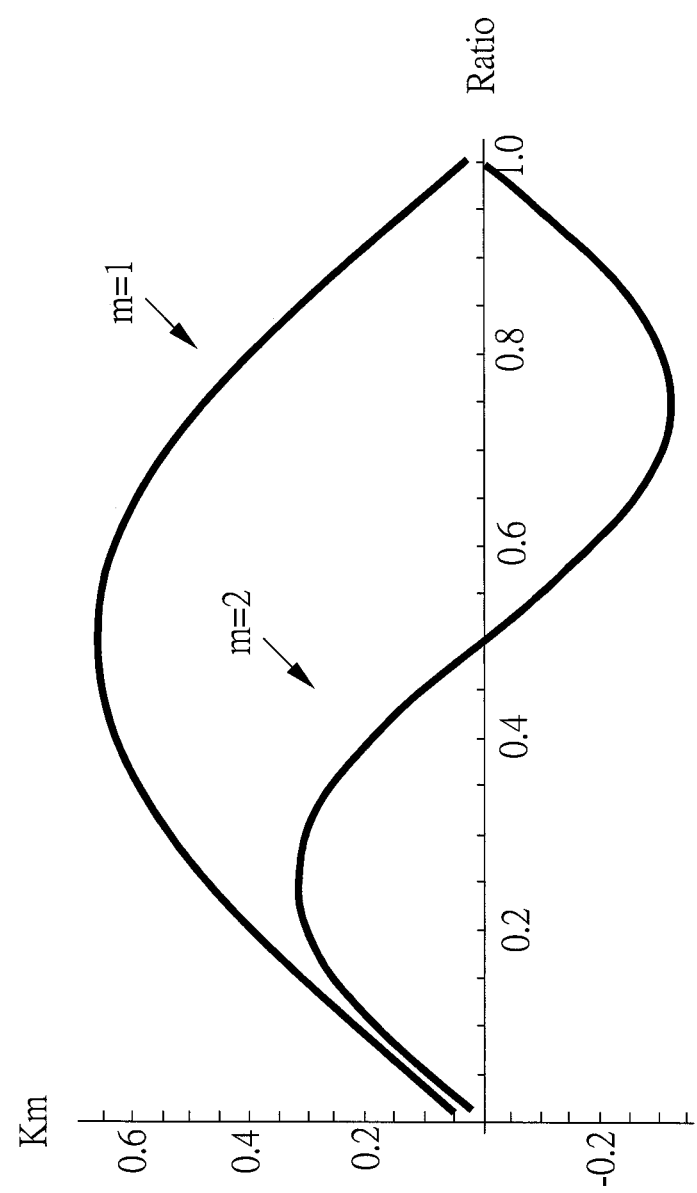
FIG. 2 is a curve graph showing the relationship between the ratio values and the coupling constant (κm) values of the in-plane cavity when m=1 and m=2.
Figure 3A:
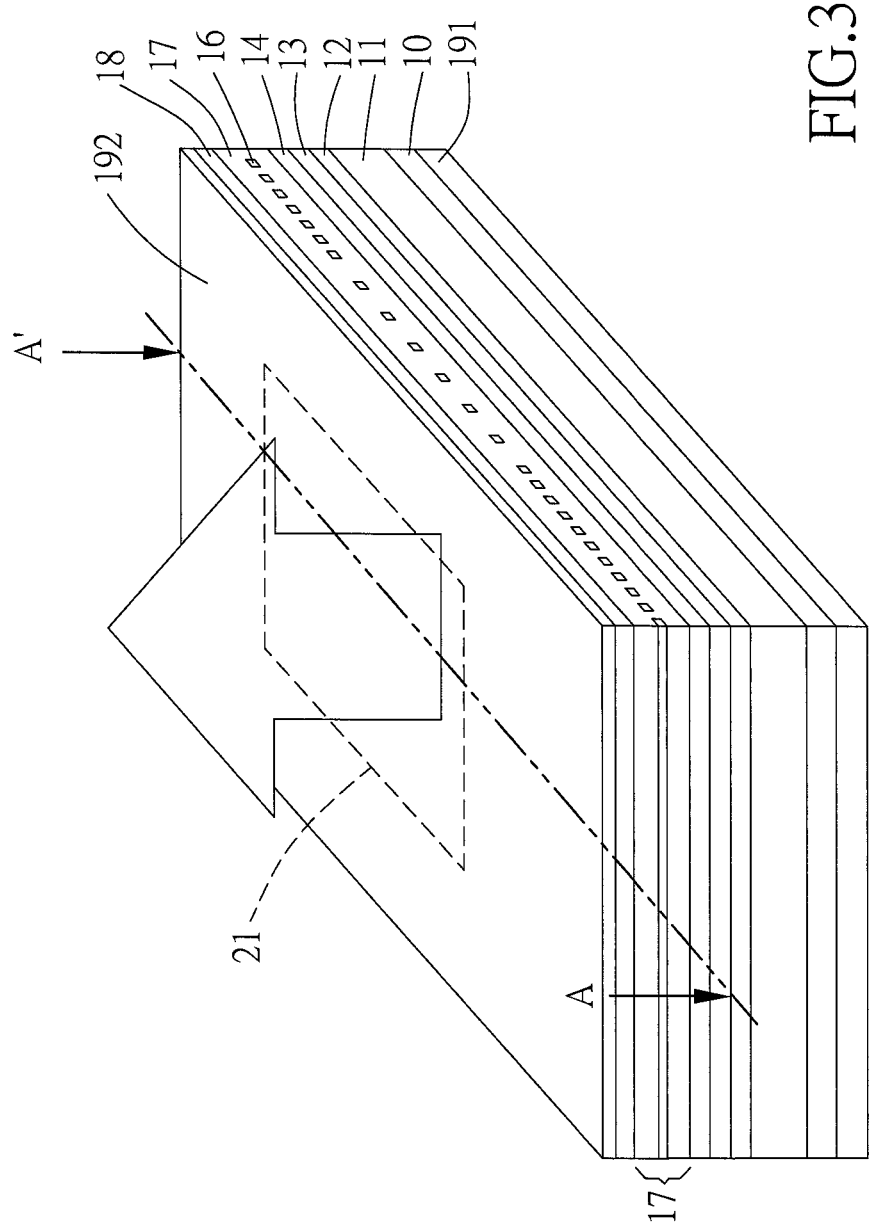
FIG. 3A, FIG. 3B and FIG. 3C respectively are a schematic three-dimensional diagram, a schematic cross-sectional diagram, and a schematic top view of grating layer of the first embodiment of the surface emitting distributed feedback laser (SE-DFB laser) with a hybrid grating structure of the present invention.
Figure 3B:
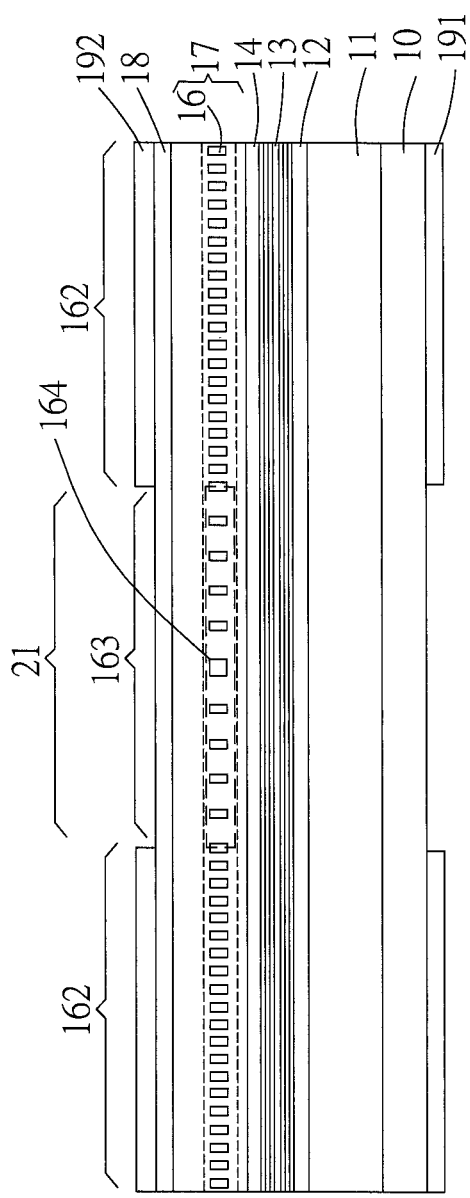
Figure 3C:
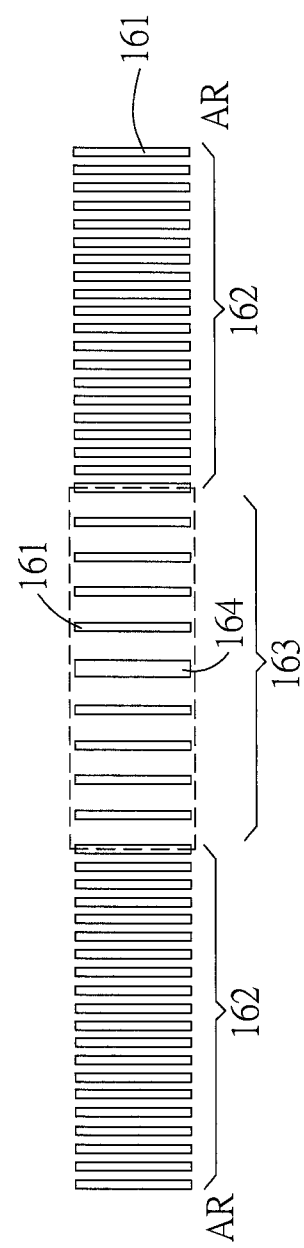

Please refer to FIG. 3A, FIG. 3B and FIG. 3C, which respectively are a schematic three-dimensional diagram, a schematic cross-sectional diagram, and a schematic top view of grating layer of the first embodiment of the surface emitting distributed feedback laser (SE-DFB laser) with a hybrid grating structure of the present invention. As shown in FIG. 3A, FIG. 3B and FIG. 3C, in the first embodiment of the invention, the structure of the SE-DFB laser can be roughly divided into: a semiconductor-laminated structure, a grating layer (Grating) 16, and two metal layers 191, 192. Wherein, the semiconductor-laminated structure can generate laser light with a laser wavelength of λ when receiving a predetermined current; and the laser light is emitted vertically upward from a light-emitting surface 21 (i.e., output window) of the semiconductor-laminated structure; and the light-emitting surface 21 is located on a top surface of the semiconductor-laminated structure; and thus, the semiconductor-laminated structure conforms to an ordinary structure of surface emitting laser diode. The grating layer 16 is located on the semiconductor-laminated structure, and the grating layer 16 has a plurality of micro-grating structures distributed and arranged along at least a first horizontal direction.

In this embodiment, the semiconductor-laminated structure comprises: a semiconductor substrate 10, a lower cladding layer 11 located on the substrate 10, a lower separated confinement hetero-structure (SCH) layer 12 located on the lower cladding layer 11, an active region layer 13 located on the lower SCH layer 12, an upper SCH layer 14 located on the active region layer 13, and a spacer (not shown in figures) located on the upper SCH layer 14. Wherein, the grating layer 16 is located above the spacer; in addition, the semiconductor-laminated structure further comprises: an upper cladding layer 17 located on the grating layer 16, and a contact layer 18 located above the upper cladding layer 17. The upper metal layer 192 is located above the contact layer 18, while the lower metal layer 191 is located under the substrate 10.

The operating principle of ordinary distributed feedback laser diodes is that, carriers such as electrons and electron holes are fed into the active region layer and confined by the carrier barrier in the quantum well to compound light and produce material gain. The principle of carrier confine is that, the barrier layer has a higher material energy gap than the quantum well layer, therefore, a lower quantum energy level will be formed in the quantum well; once the carrier is captured, it is not easy to escape. The laser light field is confined by the upper and lower cladding layers in an elongated rectangular resonant cavity formed by the upper and lower SCH layers and the active region layer. The principle of light field confine is that, the upper and lower cladding layers have a lower optical refractive index "n" value (Low Refractive Index) than the upper and lower SCH layers and the active region layer, so the light field will form a mode and propagate in a material with a relatively high "n" value (High Refractive Index) by the principle of total reflection. The degree of coupling between the light field and the quantum well of the active region layer determines the modal gain; the higher the modal gain, the easier it is to overcome the optical loss and achieve laserization (i.e., Lasing), and also easier to reduce the threshold current value of lasing (i.e., the lasing threshold current).

In an embodiment of the invention, the semiconductor substrate 10 can be an InP substrate. By epitaxy processes, the lower cladding layer 11, the lower SCH layer 12, the active region layer 13, the upper SCH layer 14 and the upper cladding layer 17 are formed orderly on the InP substrate 10. The InP substrate 10, the lower cladding layer 11 and the lower SCH layer 12 all have n-typed doping, while the upper cladding layer 17 and the contact layer 18 both has p-typed doping. The lower cladding layer 11 and the upper cladding layer 17 are made of InP. The active region layer 13 can be made of $In_{1-x-y}Al_xGa_yAs$, in which x and y are both real numbers within 0~1. The contact layer 18 can be made of InGaAs. Both the lower SCH layer 12 and the upper SCH layer 14 can be made of $In_{1-z}Al_zAs$, in which z is a real number within 0~1. Since the material compositions, structural thicknesses, doping concentrations and other parameters for layers of the semiconductor-laminated structure of the present invention can be selected from those for the conventional distributed feedback laser and are not characteristics of the present invention, thus details thereabout are omitted herein. In addition, the material compositions, the structural thicknesses, the doping concentrations and the other parameters for individual layers of the semiconductor-laminated structure of the present invention are not limited to the aforesaid embodiment. o In this embodiment, the grating layer 16 is formed inside the upper cladding layer 17. The grating layer 16 comprises a plurality of micro-grating structures arranged along at least a first horizontal direction. The grating layer 16 is divided into at least one first grating region 162 and at least one second grating region 163 along the first horizontal direction, each of the first and second grating regions 162, 163 contains a plurality of the micro-grating structures respectively.

The grating period of the plurality of micro-grating structures in the first grating region 162 is in accordance with the following mathematical formula:

$$\Lambda = m \frac{\lambda}{2 * n_{eff}};$$

in addition, the grating period of the plurality of micro-grating structures in the second grating region 163 is in accordance with the following mathematical formula:

$$\Lambda = o \frac{\lambda}{2 * n_{eff}}.$$

Wherein, $\Lambda$ is the length of grating period, $\lambda$ is the wavelength of the laser light, $n_{eff}$ is the equivalent refractive index of semiconductor waveguide, both m and o are integrals, m is not equal to o, and o is an even multiple of m. Wherein, the light-emitting surface 21 is defined by the second grating region 163. In the first embodiment, m=1, and o=2. Therefore, the first grating region 162 is a first-order grating region, and the second grating region 163 is a second-order grating region, so as to form a hybrid grating structure in the grating layer 16. The surface emitting laser emits laser light perpendicularly from the light-emitting surface 21 defined by the second grating region 163.

In this embodiment, the grating layer 16 further includes a phase-shift grating structure 164. The phase-shift grating structure 164 is located near the middle of the second grating region 163 in the first horizontal direction, and the width of the phase-shift grating structure 164 can provide a phase-difference distance, such that a phase difference is formed between the micro-grating structures located on both sides of the phase-shift grating structure 164 along the first horizontal direction. The phase-difference distance provided by the phase-shift grating structure 164 is one quarter of the laser wavelength (i.e., $\lambda/4$-Shift). By employing the $\lambda/4$-Shift phase-shift grating structure 164 in the middle of the second-order grating region, the laser light field of the laser component of the present invention can be modally stabilized and the light coupling efficiency can be improved. In addition, the number of the second grating region 163 is one and is located in a middle area of the grating layer 16 in the first horizontal direction, such that the first grating region 162 is substantially divided into left and right parts in the first horizontal direction by the second grating region 163. In this embodiment, the width of the second grating region 163 in the first horizontal direction is between one-sixth to one-half of the total width of the grating layer 16; the widths of the left and right parts of the divided first grating region 162 are approximately equal. Thereby, the surface emitting laser of the present invention integrates the first-order and second-order grating structures in the same grating layer 16. The low-loss first-order grating structure is designed to act as a high-efficiency reflection feedback area placed on the laser end-surface, while the second-order grating structure is formed only at the area near to the middle of the laser light-emitting surface (output window). In this way, it is possible to achieve the desired balance between the pursuit of high slope efficiency (meaning a larger second-order grating structure area) and low critical current value $I_{th}$ (meaning a smaller second-order grating structure area). Moreover, the $\lambda/4$-Shift phase-shift grating structure 164 is formed in middle of the second-order grating structure area, in order to make the laser light field modal stabilized and to improve the optical coupling efficiency of emitted laser light.

Figure 4:
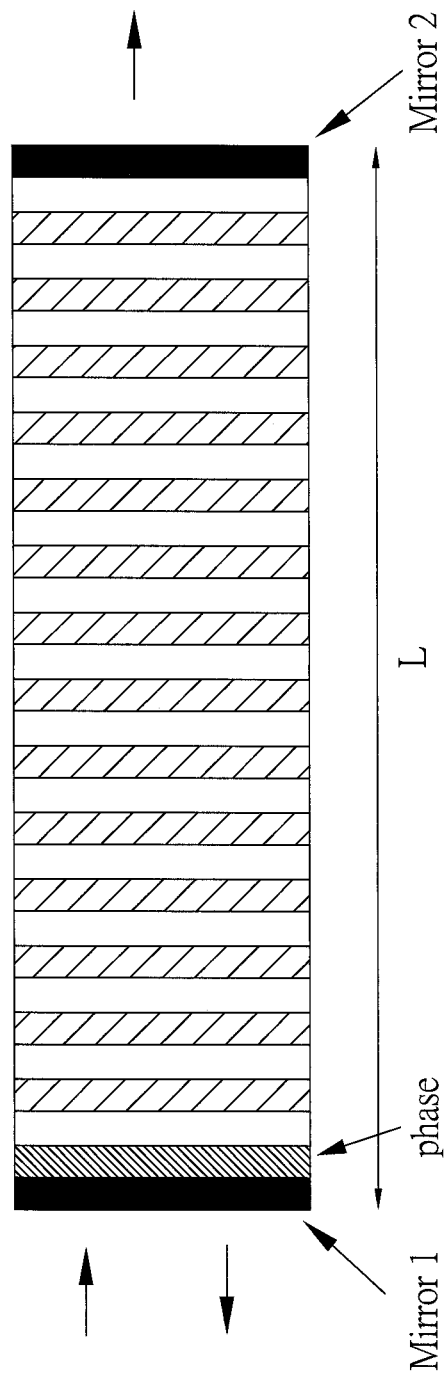
FIG. 4 is a schematic diagram showing a grating layer of a typical edge emitting DFB laser.
Figure 5A:
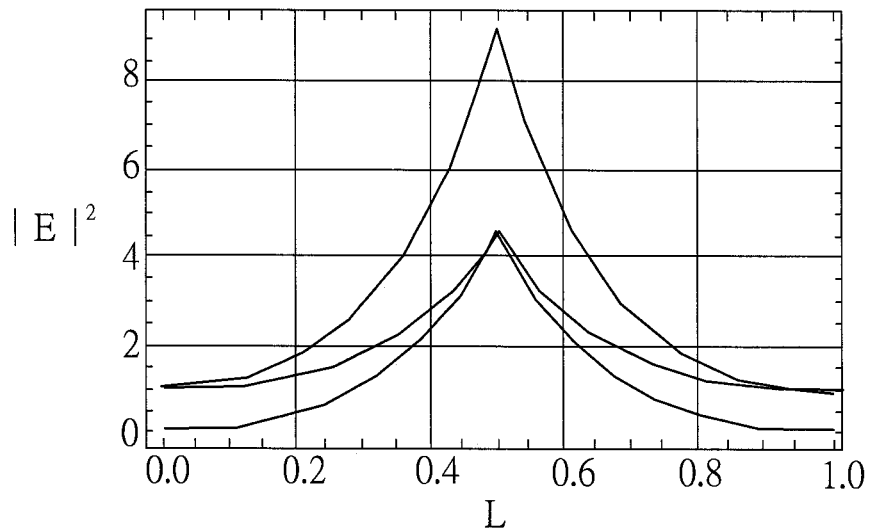
FIG. 5A to FIG. 5D respectively are curve diagrams of intensity distribution curves of the laser guided mode along the ridge obtained by the simulations; in which, four structural changes of L2 length from 0 μm, 50 μm, 100 μm to 150 μm are respectively used in the simulations; wherein L2 is the length of the second-order grating structure area located in the middle.
Figure 5B:
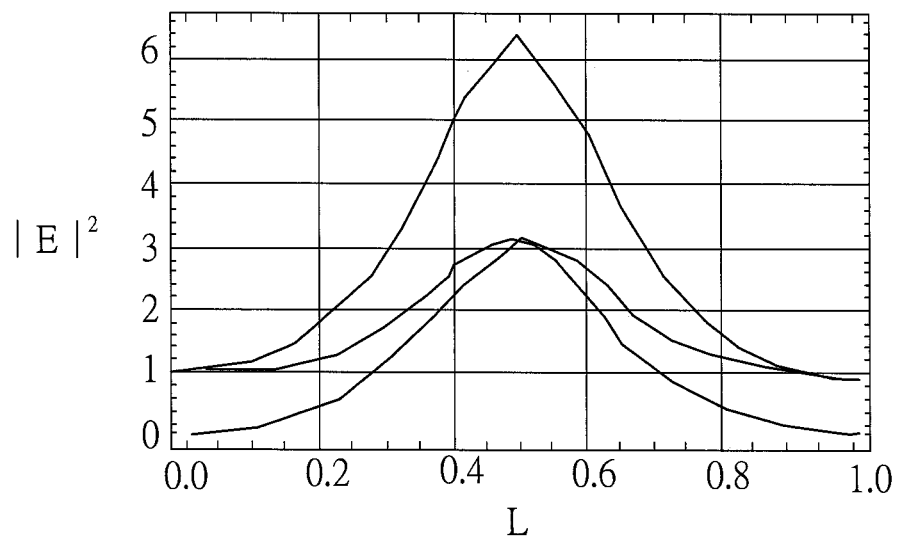
Figure 5C:
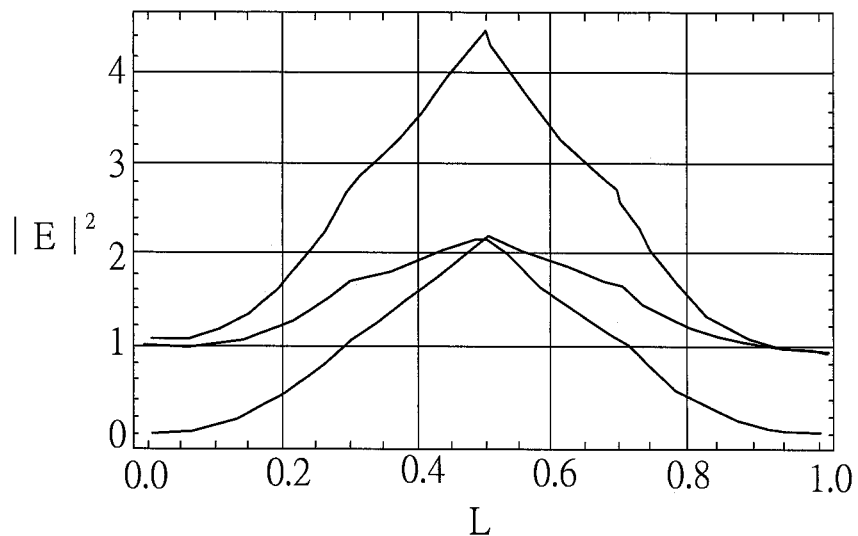
Figure 5D:
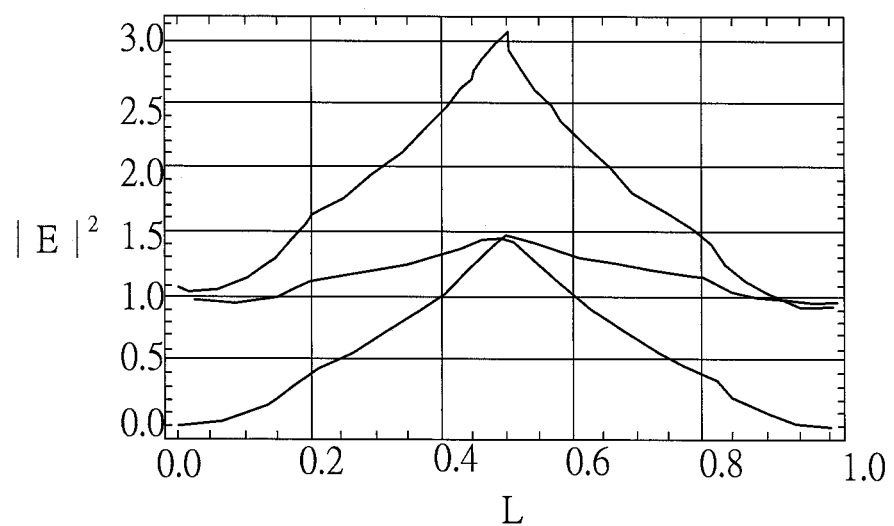
Figure 6A:
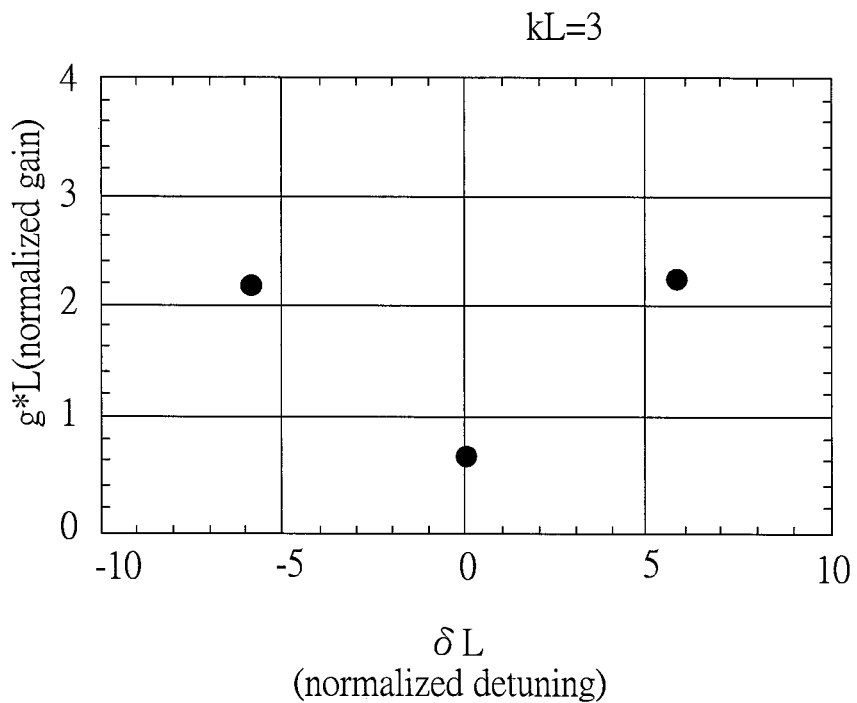
FIG. 6A to FIG. 6D respectively are relationship curve diagrams of normalized gain (g*L) versus detuning relationship (δL) obtained by the simulations for the laser component of the first embodiment; in which, four structural changes of L2 length from 0 μm, 50 μm, 100 μm to 150 μm are respectively used in the simulations.
Figure 6B:
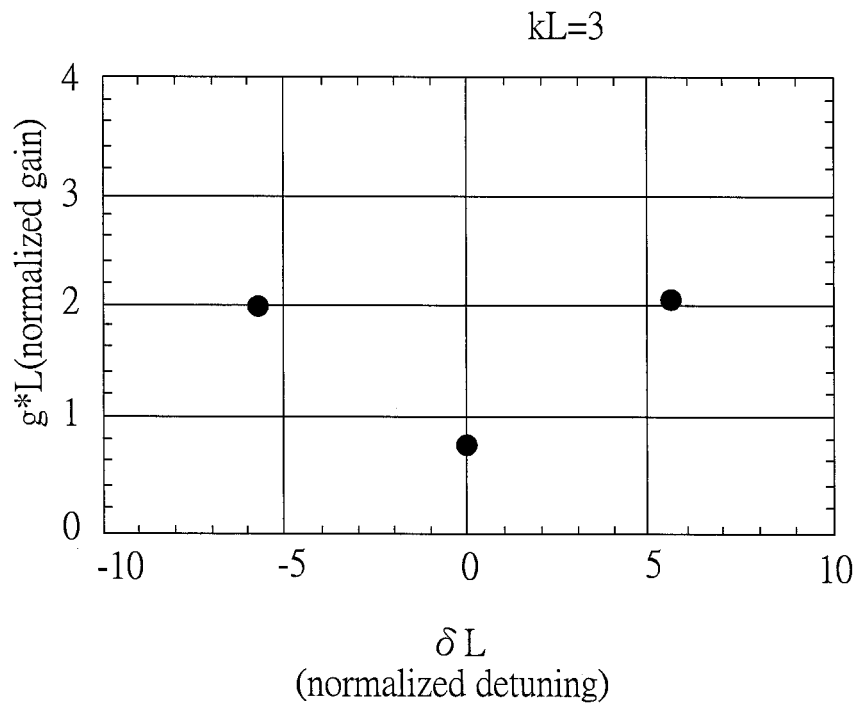
Figure 6C:
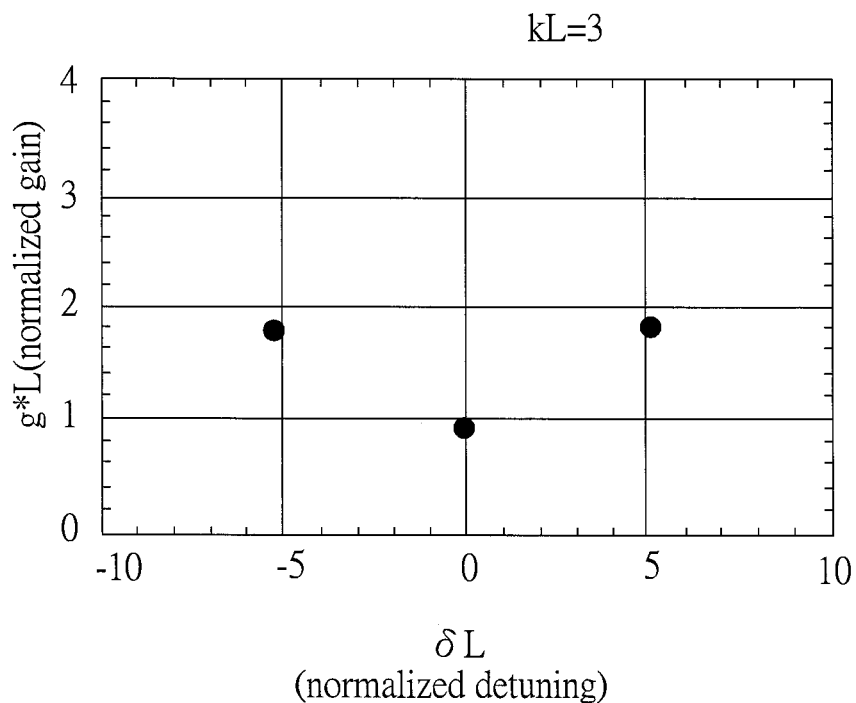
Figure 6D:
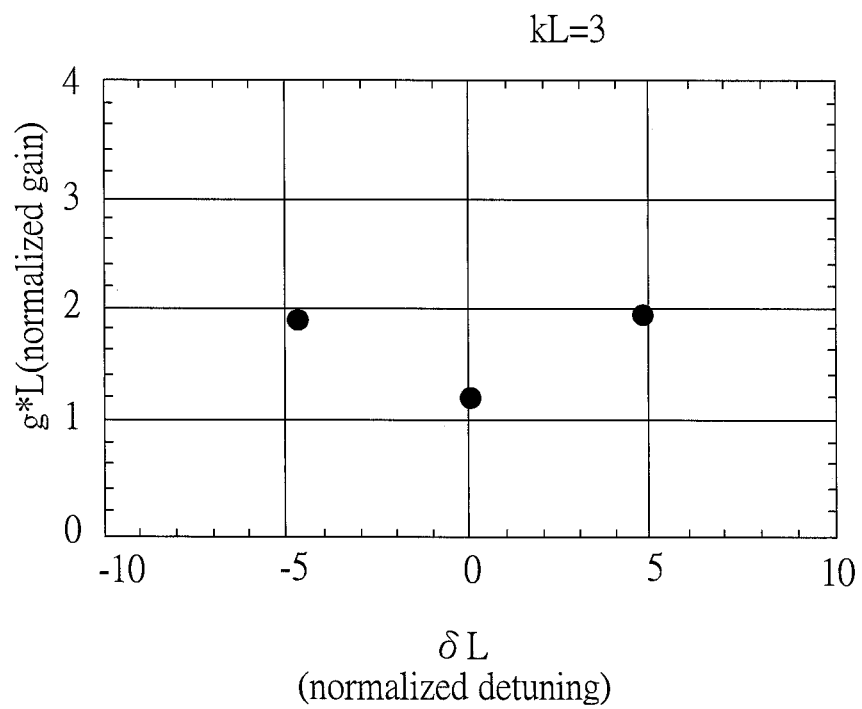
Figure 7:
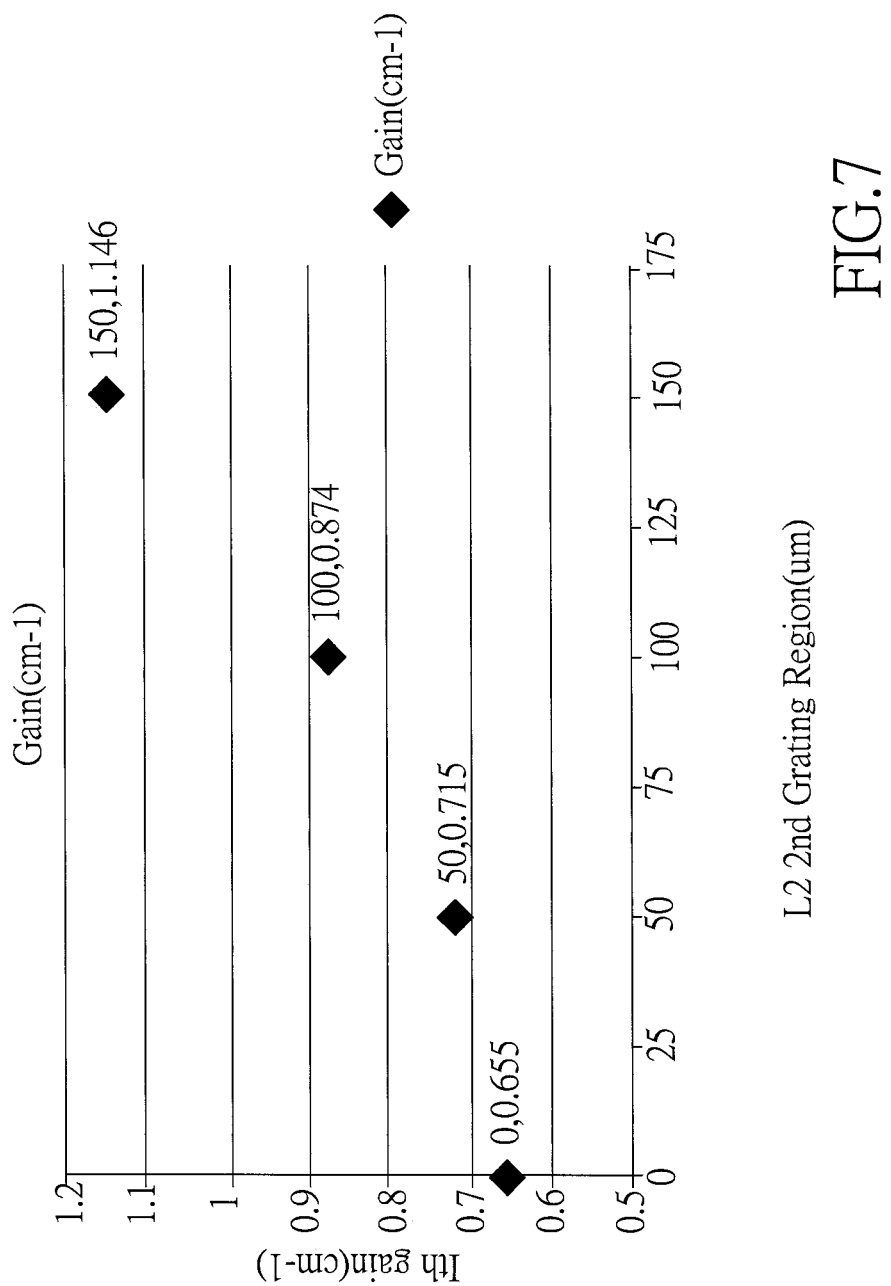
FIG. 7 is a relationship diagram of threshold gains versus different L2 lengths obtained by simulation for the laser component of the first embodiment; in which, four structural changes of L2 length from 0 μm, 50 μm, 100 μm to 150 μm are respectively used in the simulation.

Taking a typical edge emitting DFB laser shown in FIG. 4 as an example, calculations of simulation adopting the method of Transfer Matrix (referring to "Semiconductor Laser Technology" (Chinese edition), Tin-Chun Lu and Hsin-Tzong Wang, Wu-Nan Publications) can be performed by using the mathematical equations comprising:

$$\delta(\text{detune}) = \beta - \beta 0 = \left(\frac{2\pi * n_{\text{eff}}}{\lambda} + i\frac{g}{2}\right) - \left(\frac{\pi}{\Lambda}\right);$$

and $\sigma^2 = \kappa^2 - \delta^2$. Wherein, $\lambda$ is the wavelength of laser light; $n_{\text{eff}}$ is the equivalent refractive index of semiconductor waveguide; $\Lambda$ is the value of grating period; i is the i-plural number; and $\kappa$ is the coupling constant which is related to the coupling of light field and grating in the structure. A (or R) and B (or S) are the electric field strengths going right and left. If the laser component of the first embodiment of the present invention shown in FIG. 3A to FIG. 3C is used for simulation, the calculation conditions and results are as follows:

The total length (width) of the laser component is L=L1+L2=250 μm. Wherein, L is the total length of the laser component in the first horizontal direction; L2 is the length of the second-order grating structure area located in the middle; L1 is the sum of the lengths of the two first-order grating structure areas located on the left and right sides of L2. Four structural changes of L2 length from 0 μm, 50 μm, 100 μm to 150 μm are respectively used in the simulations. The coupling constant κ1 of the two first-order grating structure areas is 12 cm$^{-1}$. The coupling constant κ2 of the second-order grating structure area is 5 cm$^{-1}$. The front and rear end-surfaces of the laser component are anti-reflection (AR for short) surfaces designed with a reflectivity of around 0.1%. The intensity distribution curves of the laser guided mode along the ridge obtained by the simulations are shown in FIG. 5A to FIG. 5D (R$^2$→(right propagation)+S$^2$←(left propagation)). In these curve diagrams of FIG. 5A to FIG. 5D, the X-axis is L (Longitudinal Normalized Position), the Y-axis is |E|$^2$ (Arb. Unit), L2 is the length of the second-order grating structure area. The relationship curve diagrams of normalized gain (g*L) versus detuning relationship (δL) obtained by the simulations are shown in FIG. 6A to FIG. 6D. The relationship diagram of threshold gains versus different L2 lengths obtained by simulation is shown in FIG. 7. From the aforementioned FIG. 5A to FIG. 5D, FIG. 6A to FIG. 6D and FIG. 7, it can be understood that, generally speaking, the larger the L2 region (second-order grating structure region), the higher the light output efficiency; in addition, it can be seen from FIG. 7 that, the larger the L2 region (second-order grating structure region), the higher the I$_{th}$ (critical current). Therefore, with the above design, it is possible to make a trade-off between low critical current value and high output power value, so as to achieve desired values by adjusting the appropriate length ratio of the L2 region (second-order grating structure region). For example, but not limited to: when the width L2 of the L2 region (second-order grating structure region) in the first horizontal direction is between ⅙ and ½ of the total width L of the grating layer, the best balance between the high slope efficiency and the low critical current value I$_{th}$ can be achieved. Such feature is difficult for the conventional technology (e.g., a DFB laser with the second-order grating structure only) to achieve.

The same concept of the aforementioned embodiment can also be transformed from a one-dimensional grating structure to a two-dimensional photonic crystal surface emitting laser (PCSEL). The first-order photonic crystals are formed around four sides of the laser component, and the second-order photonic crystals are formed only in the middle of the light-emitting surface, and a phase-shift structure is properly introduced to manipulate the modal. It is also possible to deploy several light-emitting areas at the same time (that is, only deploy second-order photonic crystals at the light-emitting locations) to achieve an effect similar to a multi-light source two-dimensional array phase lock (2D array phase lock). In other embodiments of the present invention described below, the structures or functions of most components are the same or similar to those of the aforementioned embodiments, therefore, the same or similar components will be directly given with the same name and numeral, and the details will not be repeated.

Figure 8:
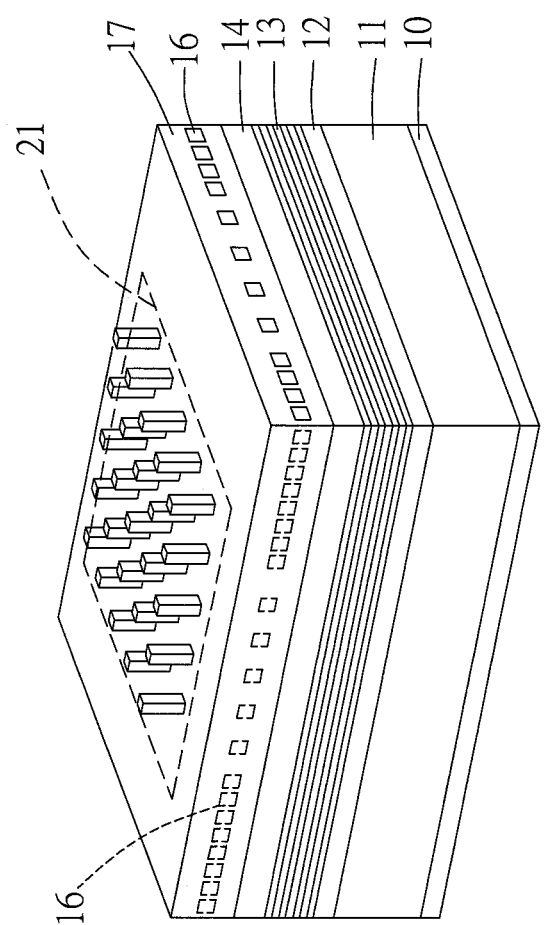
FIG. 8 and FIG. 9 respectively are a schematic three-dimensional diagram and a schematic top view of grating layer of the second embodiment of the surface emitting laser component in accordance with the present invention.
Figure 9:
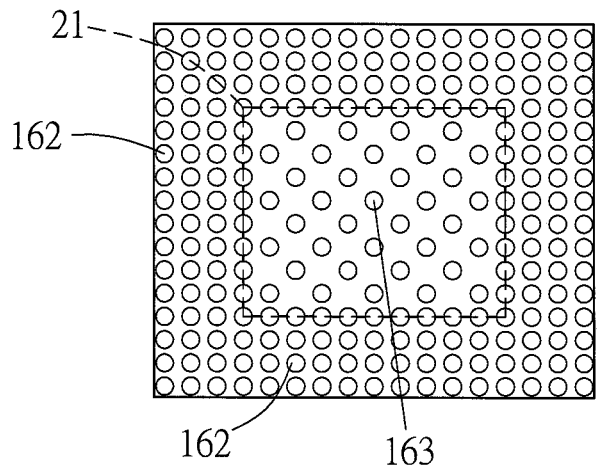

Please refer to FIG. 8 and FIG. 9, which respectively are a schematic three-dimensional diagram and a schematic top view of grating layer of the second embodiment of the surface emitting laser component in accordance with the present invention. In the second embodiment, the surface emitting laser component can be a surface emitting DFB laser component or a photonic crystal surface emitting laser (PCSEL) component, whose structure can be roughly divided into: a semiconductor-laminated structure and a grating layer (or photonic crystal layer) 16 located on the semiconductor-laminated structure. The semiconductor-laminated structure can generate laser light with a laser wavelength of λ when receiving a predetermined current; and the laser light is emitted vertically upward from a light-emitting surface 21 (i.e., output window) of the semiconductor-laminated structure. The light-emitting surface 21 is located on a top surface of the semiconductor-laminated structure. The semiconductor-laminated structure comprises (from bottom to top): a semiconductor substrate 10, a lower cladding layer 11, a lower separated confinement heterostructure (SCH) 12, an active region layer 13, an upper SCH 14, the grating layer (or photonic crystal layer) 16, a upper cladding layer 17, a contact layer (not shown in this figure), a metal layer (not shown in this figure), and etc.

In this embodiment, the grating layer (or photonic crystal layer) 16 not only has a plurality of micro-grating (or photonic crystal) structures distributed and arranged along at least the first horizontal direction, in addition, the grating layer (or photonic crystal layer) 16 also has a plurality of micro-grating (or photonic crystal) structures along the second horizontal direction. The second horizontal direction is perpendicular to the first horizontal direction, and both the second horizontal direction and the first horizontal direction are perpendicular to the emitting direction (output direction) of the laser light. The grating layer (or photonic crystal layer) 16 is divided into at least one first grating (or photonic crystal) region 162 and at least one second grating (or photonic crystal) region 163 along the first horizontal direction, each of the first and second grating (or photonic crystal) regions 162, 163 contains a plurality of the micro-grating (or micro photonic crystal) structures respectively. In addition, the grating layer (or photonic crystal layer) 16 is also divided into at least one first grating (or photonic crystal) region 162 and at least one second grating (or photonic crystal) region 163 along the second horizontal direction, each of the first and second grating (or photonic crystal) regions 162, 163 also contains a plurality of the micro-grating (or micro photonic crystal) structures respectively. Wherein, no matter in the first horizontal direction or in the second horizontal direction, the grating (or photonic crystal) period of the plurality of micro-grating (or micro photonic crystal) structures in the first grating (or photonic crystal) region 162 is in accordance with the following mathematical formula:

$$\Lambda = m\frac{\lambda}{2*n_{\mathit{eff}}};$$

in addition, the grating (or photonic crystal) period of the plurality of micro-grating (or micro photonic crystal) structures in the second grating (or photonic crystal) region 163 is also in accordance with the following mathematical formula:

$$\Lambda = o\frac{\lambda}{2*n_{\mathit{eff}}};$$

Wherein, Λ is the length of grating (or photonic crystal) period, λ is the wavelength of the laser light, $n_{\mathit{eff}}$ is the equivalent refractive index of semiconductor waveguide, m=1 and o=2. Therefore, the first grating (or photonic crystal) region 162 is a first-order grating (or photonic crystal) region, and the second grating (or photonic crystal) region 163 is a second-order grating (or photonic crystal) region, so as to form a hybrid grating structure (or hybrid photonic crystal structure) in the grating layer 16. The surface emitting laser emits laser light perpendicularly from the light-emitting surface 21 defined by the second grating (or photonic crystal) region 163. Thereby, when viewed downwardly from the top surface of the semiconductor-laminated structure (as shown in FIG. 9), the plurality of micro-grating (or micro photonic crystal) structures are arranged in a dot-like array on the grating (or photonic crystal) layer 16; and moreover, the second grating (or photonic crystal) region 163 in the first horizontal direction and the second grating (or photonic crystal) region 163 in the second horizontal direction cooperate to define at least one rectangular light-emitting surface 21.

Furthermore, in this embodiment, the second grating (or photonic crystal) region 163 is located in an intermediate region of the grating (or photonic crystal) layer 16 in both the first horizontal direction and the second horizontal direction. In other words, when viewed downwardly from the top surface of the semiconductor-laminated structure, the second grating (or photonic crystal) region 163 is located in a central region of the top surface of the semiconductor-laminated structure, and the first grating (or photonic crystal) region 162 is substantially surrounding the outer peripheral region of the second grating (or photonic crystal) region 163. Wherein, the widths of the second grating (or photonic crystal) region 163 in the first horizontal direction and the second horizontal direction are each between ⅙ to ½ of the total width of the grating (or photonic crystal) layer 16 in the first horizontal direction and the second horizontal direction respectively.

Figure 10:
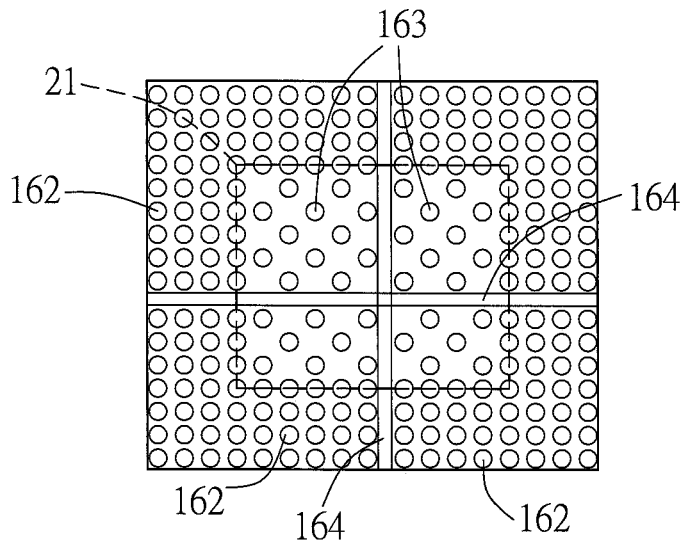
FIG. 10 is a schematic top view of grating (or photonic crystal) layer of the third embodiment of the surface emitting laser component with hybrid grating structure (or hybrid photonic crystal structure) in accordance with the present invention.

Please refer to FIG. 10, which is a schematic top view of grating (or photonic crystal) layer of the third embodiment of the surface emitting laser component with hybrid grating structure (or hybrid photonic crystal structure) in accordance with the present invention. Most of the structures of the laser component of the third embodiment is the same as the second embodiment shown in FIG. 8 and FIG. 9; the only difference is that, in the third embodiment shown in FIG. 10, the grating (or photonic crystal) layer includes two phase-shift grating (or photonic crystal) structures 164. One of the phase-shift grating (or photonic crystal) structures 164 is located in the second grating (or photonic crystal) region 163 near the middle of the first horizontal direction, the other phase-shift grating (or photonic crystal) structure 164 is located in the second grating (or photonic crystal) region 163 near the middle of the second horizontal direction. The width of each of the phase-shift grating (or photonic crystal) structures 164 can provide a phase-difference distance, such that a phase difference is formed between the micro-grating (or micro photonic crystal) structures located on both sides of the phase-shift grating (or photonic crystal) structure 164 along the first horizontal direction and the second horizontal direction respectively. The phase-difference distance provided by the phase-shift grating (or photonic crystal) structure 164 is one quarter of the laser wavelength (i.e., λ/4-Shift).

Figure 11:
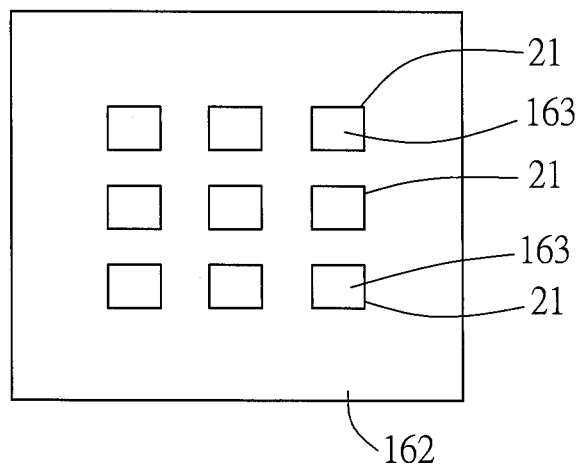
FIG. 11 is a schematic top view of grating (or photonic crystal) layer of the fourth embodiment of the surface emitting laser component with hybrid grating structure (or hybrid photonic crystal structure) in accordance with the present invention.

Please refer to FIG. 11, which is a schematic top view of grating (or photonic crystal) layer of the fourth embodiment of the surface emitting laser component with hybrid grating structure (or hybrid photonic crystal structure) in accordance with the present invention. Most of the structures of the laser component of the fourth embodiment is the same as the second embodiment shown in FIG. 8 and FIG. 9; the only difference is that, in the fourth embodiment shown in FIG. 11, the top surface of the semiconductor-laminated structure includes a plurality of individual light-emitting surfaces 21 separated from each other and arranged in an array. The grating (or photonic crystal) layer is provided with the second grating (or photonic crystal) region 163 at each light-emitting surface 21, no matter in the first horizontal direction or the second horizontal direction. Moreover, except for the light-emitting surfaces 21, other portions of the grating (or photonic crystal) layer are all provided with the first grating (or photonic crystal) region 162 regardless of whether it is in the first horizontal direction or the second horizontal direction. Thereby, a plurality of small and individual light-emitting surfaces 21 that are separated from each other and arranged in an array can be defined on the top surface of the semiconductor-laminated structure, so as to achieve a luminous effect similar to a plurality of small laser light sources array.

Please refer to FIG. 12A and FIG. 12B, which respectively are the schematic diagrams of micro-grating structures of the traditional distributed feedback laser component with merely the first-order grating structure, and the surface emitting laser component with the first-order and second-order hybrid grating structure of the present invention. As shown in FIG. 12B, the primary feature of the surface emitting laser component with the first-order and second-order hybrid grating structure of the present invention is that, the regions 162 and 163 of the first-order grating structure and the second-order grating structure can be seamlessly integrated in the grating layer, and a phase-shift grating structure 164 is formed in the middle of the light output window (light-emitting surface 21). The integrating method can start from the first-order grating structure, and remove odd or even numbered gratings in a specific area, so as to form the second-order grating structure area with twice the period of the first-order grating structure area. The same concept can also be employed to a two-dimensional photonic crystal surface emitting laser (PCSEL); wherein, the outer peripheral portion of photonic crystal layer of the PCSEL is formed with the first-order photonic crystal structure, while the second-order photonic crystal structure can be freely arranged and formed in any intermediate region of the photonic crystal layer in order to act as the light-emitting surface (light output window).

Figure 13A:
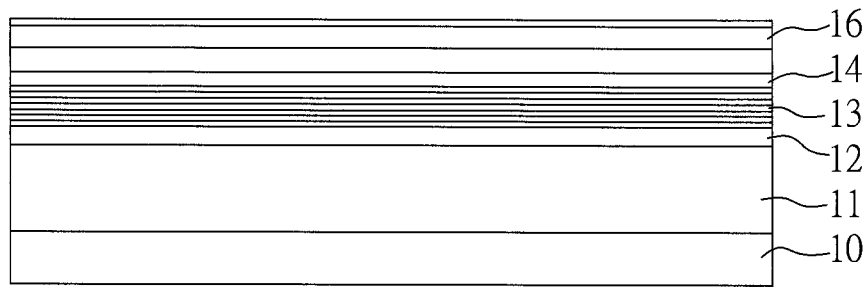
FIG. 13A to FIG. 13C respectively are schematic diagrams of several steps of the fabricating method of the surface-emitting laser with hybrid grating structure of the present invention.
Figure 13B:
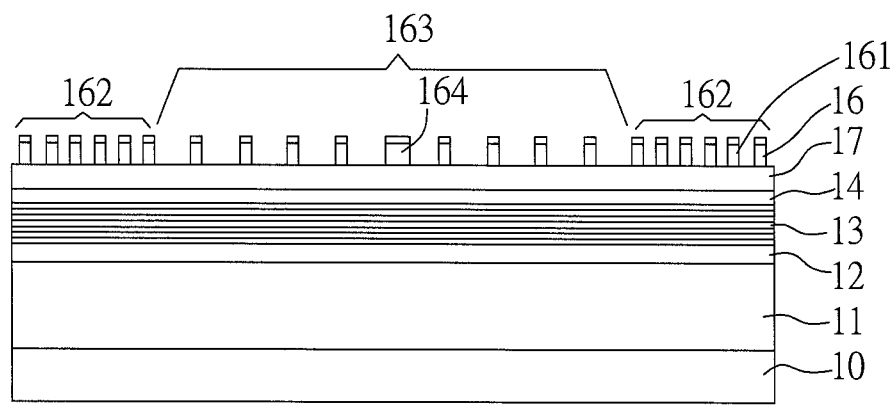
Figure 13C:
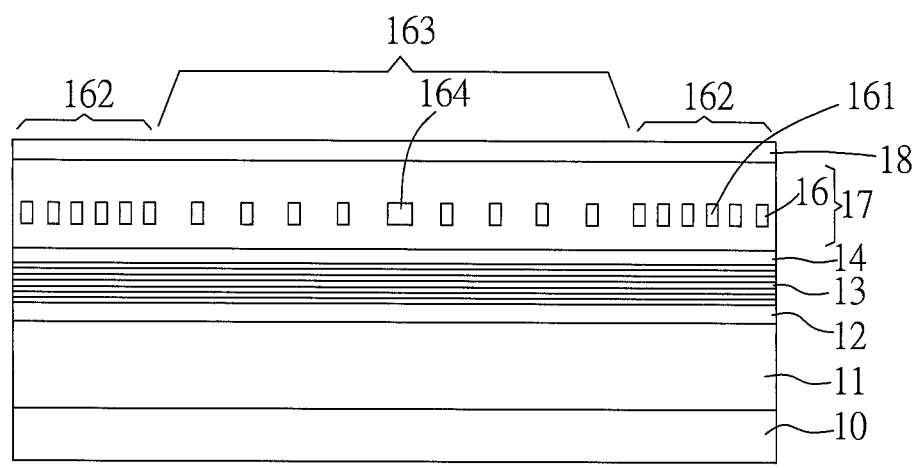

Please refer to FIG. 13A to FIG. 13C, which respectively are schematic diagrams of several steps of the fabricating method of the surface-emitting laser with hybrid grating structure of the present invention. In a preferred embodiment of the present invention, the fabricating method of the surface-emitting laser with hybrid grating structure comprises the following steps:

STEP (A): as shown in FIG. 13A, through the metal organic chemical vapor deposition (MOCVD) or other conventional semiconductor epitaxy processes, a semiconductor-laminated structure, a grating layer 16 and a protective layer can be orderly formed on a semiconductor substrate. The semiconductor-laminated structure can generate a laser beam (laser light) with a specific laser wavelength upon receiving an electric current, and then the laser beam can be emitted out of the semiconductor-laminated structure through a light-emitting surface (light output window) located at a top surface of the semiconductor-laminated structure. The semiconductor-laminated structure includes, in an upward order, the semiconductor substrate 10, a lower cladding layer 11, a lower SCH layer 12, an active region layer 13, an upper SCH layer 14 and a spacer layer.

STEP (B): As shown in FIG. 13B, through e-beam writer and nano imprint processes, a plurality of micro-grating structures arranged at least in a first horizontal direction are formed in the grating layer 16 of the semiconductor-laminated structure. The grating layer 16 is divided into at least one first grating region 162 and at least one second grating region 163 at least along the first horizontal direction, each of the first and second grating regions 162, 163 contains a plurality of the micro-grating structures respectively. The at least one first grating region 162 is located at a peripheral region of the grating layer, while the at least one second grating region 163 is located at an intermediate region of the grating layer. A phase-shift grating structure is located near the middle of the second grating region 163 in the first horizontal direction. The grating period of the plurality of micro-grating structures in the first grating region 162 is in accordance with the following mathematical formula:

$$\Lambda = m\frac{\lambda}{2*n_{eff}};$$

in addition, the grating period of the plurality of micro-grating structures in the second grating region 163 is in accordance with the following mathematical formula:

$$\Lambda = o\frac{\lambda}{2*n_{eff}}.$$

Wherein, $\Lambda$ is the length of grating period, $\lambda$ is the wavelength of the laser light, $n_{eff}$ is the equivalent refractive index of semiconductor waveguide, both m and o are integrals, m is not equal to o, and o is an even multiple of m. Wherein, the light-emitting surface 21 is defined by the second grating region 163.

STEP (C): as shown in FIG. 13C, conventional epitaxy process and yellow-light process are further applied to form orderly an upper cladding layer 17 and a contact layer 18 upon the grating layer 16, so as to form the surface-emitting laser with hybrid grating structure of the present invention.

Figure 14:
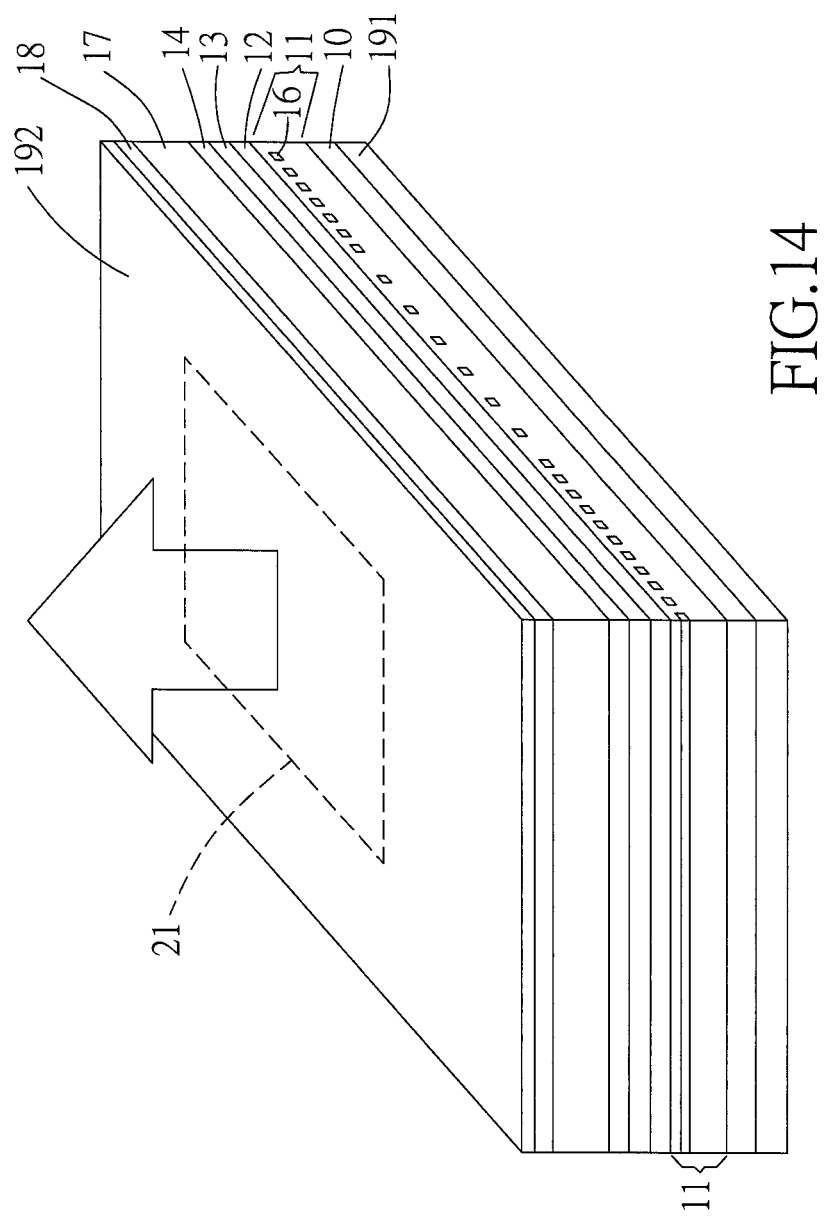
FIG. 14 is a schematic three-dimensional view of the fifth embodiment of the surface emitting laser component in accordance with the present invention.

Please refer to FIG. 14, which is a schematic three-dimensional view of the fifth embodiment of the surface emitting laser component in accordance with the present invention. Most of the structures of the laser component of the fifth embodiment is the same as the first embodiment shown in FIG. 3A; the only difference is that, in the fifth embodiment shown in FIG. 14, the grating (or photonic crystal) layer 16 is located inside the lower cladding layer 11 to form a p-side down surface emitting laser component.

While the present invention has been particularly shown and described with reference to a preferred embodiment, it will be understood by those skilled in the art that various changes in form and detail may be achieved without departing from the spirit and scope of the present invention.

What is claimed is:

1. A surface emitting laser with hybrid grating structure, comprising:
   a semiconductor-laminated structure, capable of generating a laser light with a laser wavelength when receiving a predetermined current; the laser light being emitted vertically upward from a light-emitting surface of the semiconductor-laminated structure; the light-emitting surface being located on a top surface of the semiconductor-laminated structure; and
   a grating layer, formed on the semiconductor-laminated structure; the grating layer including a plurality of micro-grating structures distributed and arranged along at least a first horizontal direction;
   wherein, the grating layer is divided into at least one first grating region and at least one second grating region at least along the first horizontal direction; each of the first and second grating regions respectively contains a plurality of the micro-grating structures;
   wherein, a grating period of the micro-grating structures in the first grating region is in accordance with the following mathematical formula:

$$\Lambda = m\frac{\lambda}{2*n_{eff}};$$

in addition, the grating period of the micro-grating structures in the second grating region is in accordance with the following mathematical formula:

$$\Lambda = o\frac{\lambda}{2*n_{eff}};$$

wherein, $\Lambda$ is a length of grating period, $\lambda$ is a wavelength of the laser light, $n_{eff}$ is an equivalent refractive index of semiconductor waveguide, both m and o are integrals, m is not equal to o, and o is an even multiple of m;
   wherein, the light-emitting surface is defined by the second grating region;
   wherein m=1, and o=2; therefore, the first grating region is a first-order grating region, and the second grating region is a second-order grating region, so as to form a hybrid grating structure in the grating layer; the surface emitting laser emits laser light perpendicularly from the light-emitting surface defined by the second grating region;
   wherein the grating layer also has a plurality of micro-grating structures along a second horizontal direction; the second horizontal direction is perpendicular to the first horizontal direction, and both the second horizontal direction and the first horizontal direction are perpendicular to the emitting direction of the laser light; the grating layer is also divided into at least one first grating region and at least one second grating region along the second horizontal direction, each of the first and second grating regions also contains a plurality of the micro-grating structures respectively; when viewed downwardly from the top surface of the semiconductor-laminated structure, the micro-grating structures are arranged in a dot-like array on the grating layer; in addition, the second grating region in the first horizontal direction and the second grating region in the second horizontal direction cooperate to define at least one rectangular light-emitting surface;

wherein the grating layer comprises two phase-shift grating structures; one of the phase-shift grating structures is located near a middle of the second grating region in the first horizontal direction, the other phase-shift grating structure is located near another middle of the second grating region in the second horizontal direction; the width of each of the phase-shift grating structures can provide a phase-difference distance, such that a phase difference is formed between the micro-grating structures located on both sides of the phase-shift grating structure along the first horizontal direction and the second horizontal direction respectively; the phase-difference distance provided by the phase-shift grating structure is one quarter of the laser wavelength.

2. The surface emitting laser with hybrid grating structure of claim 1, wherein the second grating region is located in an intermediate region of the grating layer in both the first horizontal direction and the second horizontal direction; when viewed downwardly from the top surface of the semiconductor-laminated structure, the second grating region is located in a central region of the top surface of the semiconductor-laminated structure, and the first grating region is substantially surrounding an outer peripheral region of the second grating region; wherein, the widths of the second grating region in the first horizontal direction and the second horizontal direction are each between ⅙ to ½ of the total width of the grating layer in the first horizontal direction and the second horizontal direction respectively.

3. The surface emitting laser with hybrid grating structure of claim 1, wherein the semiconductor-laminated structure comprises:
a semiconductor substrate;
a lower cladding layer, located on the substrate;
a lower separated confinement hetero-structure (SCH), located on the lower cladding layer;
an active region layer, located on the lower SCH layer;
an upper SCH layer, located on the active region layer;
a spacer, located on the upper SCH layer; wherein, the grating layer is located above the space;
an upper cladding layer, located on the grating layer; and
a contact layer, located above the upper cladding layer.

4. A method for fabricating a surface emitting laser with hybrid grating structure, said method comprising:
applying a semiconductor epitaxy process to form a semiconductor-laminated structure on a semiconductor substrate; the semiconductor-laminated structure generating a laser beam with a laser wavelength upon receiving an electric current; the semiconductor-laminated structure emitting the laser beam from a light-emitting surface located at a top surface of the semiconductor-laminated structure;
applying an e-beam writer process and a nano imprint process to form a grating layer on the semiconductor-laminated structure; the grating layer comprising a plurality of micro-grating structures arranged at least in a first horizontal direction;
applying an epitaxy process and a yellow-light process to form an upper cladding layer and a contact layer on the grating layer;
wherein, the grating layer is divided into at least one first grating region and at least one second grating region at least along the first horizontal direction, each of the first and second grating regions contains a plurality of the micro-grating structures respectively;
wherein, the grating period of the micro-grating structures in the first grating region is in accordance with the following mathematical formula:

$$\Lambda = m\frac{\lambda}{2*n_{\mathit{eff}}};$$

in addition, the grating period of the micro-grating structures in the second grating region is in accordance with the following mathematical formula:

$$\Lambda = o\frac{\lambda}{2*n_{\mathit{eff}}};$$

wherein, $\Lambda$ is a length of grating period; $\lambda$ is a wavelength of the laser light; $n_{\mathit{eff}}$ is an the equivalent refractive index of semiconductor waveguide; both m and o are integrals; m is not equal to o; and o is an even multiple of m;
wherein, the light-emitting surface is defined by the second grating region.

5. The method for fabricating a surface emitting laser with hybrid grating structure of claim 4, wherein m=1, and o=2; therefore, the first grating region is a first-order grating region, and the second grating region is a second-order grating region, so as to form a hybrid grating structure in the grating layer; the surface emitting laser emits laser light perpendicularly from the light-emitting surface defined by the second grating region.

6. The method for fabricating a surface emitting laser with hybrid grating structure of claim 5, wherein the grating layer further includes a phase-shift grating structure; the phase-shift grating structure is located near a middle of the second grating region in the first horizontal direction; the width of the phase-shift grating structure can provide a phase-difference distance, such that a phase difference is formed between the micro-grating structures located on both sides of the phase-shift grating structure along the first horizontal direction; the phase-difference distance provided by the phase-shift grating structure is one quarter of the laser wavelength.

7. The method for fabricating a surface emitting laser with hybrid grating structure of claim 5, wherein the grating layer also has a plurality of micro-grating structures along a second horizontal direction; the second horizontal direction is perpendicular to the first horizontal direction, and both the second horizontal direction and the first horizontal direction are perpendicular to the emitting direction of the laser light; the grating layer is also divided into at least one first grating region and at least one second grating region along the second horizontal direction, each of the first and second grating regions also contains a plurality of the micro-grating structures respectively; when viewed downwardly from the top surface of the semiconductor-laminated structure, the micro-grating structures are arranged in a dot-like array on the grating layer; in addition, the second grating region in the first horizontal direction and the second grating region in the second horizontal direction cooperate to define at least one rectangular light-emitting surface.

8. The method for fabricating a surface emitting laser with hybrid grating structure of claim 7, wherein the grating layer comprises two phase-shift grating structures; one of the phase-shift grating structures is located near a middle of the second grating region in the first horizontal direction, the other phase-shift grating structure is located near another middle of the second grating region in the second horizontal direction; the width of each of the phase-shift grating structures can provide a phase-difference distance, such that a phase difference is formed between the micro-grating structures located on both sides of the phase-shift grating structure along the first horizontal direction and the second horizontal direction respectively; the phase-difference distance provided by the phase-shift grating structure is one quarter of the laser wavelength.

9. The method for fabricating a surface emitting laser with hybrid grating structure of claim 7, wherein the second grating region is located in an intermediate region of the grating layer in both the first horizontal direction and the second horizontal direction; when viewed downwardly from the top surface of the semiconductor-laminated structure, the second grating region is located in a central region of the top surface of the semiconductor-laminated structure, and the first grating region is substantially surrounding an outer peripheral region of the second grating region; wherein, the widths of the second grating region in the first horizontal direction and the second horizontal direction are each between $1/6$ to $1/2$ of the total width of the grating layer in the first horizontal direction and the second horizontal direction respectively.

* * * * *